United States Patent
Kitagawa

(10) Patent No.: US 9,530,874 B2
(45) Date of Patent: Dec. 27, 2016

(54) SEMICONDUCTOR DEVICE

(71) Applicant: KABUSHIKI KAISHA TOSHIBA, Tokyo (JP)

(72) Inventor: Mitsuhiko Kitagawa, Bunkyo Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/635,946

(22) Filed: Mar. 2, 2015

(65) Prior Publication Data

US 2016/0071964 A1 Mar. 10, 2016

(30) Foreign Application Priority Data

Sep. 5, 2014 (JP) .................................. 2014-181139

(51) Int. Cl.
*H01L 29/66* (2006.01)
*H01L 29/15* (2006.01)
*H01L 29/739* (2006.01)

(52) U.S. Cl.
CPC ................................ *H01L 29/7397* (2013.01)

(58) Field of Classification Search
CPC ............. H01L 29/7397; H01L 29/4236; H01L 29/7813; H01L 29/41766; H01L 29/7825
USPC .... 257/77, 132, 330, 340, 342, E29.21, 126, 257/146, E21.7, 135, E21.41, 168, 487, 257/355, 41, 493, E21.21; 438/138, 270, 438/133
See application file for complete search history.

(56) References Cited

U.S. PATENT DOCUMENTS

| | | | |
|---|---|---|---|
| 6,399,998 B1* | 6/2002 | Chang | H01L 29/7397 257/139 |
| 7,250,639 B1* | 7/2007 | Suekawa | H01L 29/0834 257/133 |
| 9,024,382 B2 | 5/2015 | Kitagawa | |
| 2004/0021173 A1* | 2/2004 | Sapp | H01L 29/7813 257/330 |
| 2005/0258493 A1* | 11/2005 | Aono | H01L 21/263 257/370 |
| 2010/0078707 A1* | 4/2010 | Haeberlen | H01L 29/7813 257/328 |
| 2010/0090248 A1* | 4/2010 | Kouno | H01L 29/861 257/140 |

(Continued)

FOREIGN PATENT DOCUMENTS

JP 2009-188290 8/2009

*Primary Examiner* — Dzung Tran
(74) *Attorney, Agent, or Firm* — Patterson & Sheridan, LLP

(57) ABSTRACT

A semiconductor device includes a first semiconductor region of a second conductivity type, and a second semiconductor region of a first conductivity type. A third semiconductor region of a first conductivity type is selectively provided on the second semiconductor region. A fourth semiconductor region of the first conductivity type and a fifth semiconductor region of the second conductivity type are selectively provided on the third semiconductor region. A first electrode is provided on a second insulating film within the second semiconductor region. A second electrode is in contact with the fifth semiconductor region and the third semiconductor region. The sixth semiconductor region is provided on the second semiconductor region at least in a portion thereon other than the area where the third semiconductor region is provided. The sixth semiconductor region is not in contact with the second electrode.

20 Claims, 5 Drawing Sheets

(56) References Cited

U.S. PATENT DOCUMENTS

2010/0327313 A1* 12/2010 Nakamura .......... H01L 29/0834
　　　　　　　　　　　　　　　　　　　　257/133
2013/0248924 A1*　9/2013 Matsudai ............ H01L 29/7397
　　　　　　　　　　　　　　　　　　　　257/139

* cited by examiner

SEMICONDUCTOR DEVICE

CROSS-REFERENCE TO RELATED APPLICATION

This application is based upon and claims the benefit of priority from Japanese Patent Application No. 2014-181139, filed Sep. 5, 2014, the entire contents of which are incorporated herein by reference.

FIELD

Embodiments described herein relate generally to a semiconductor device.

BACKGROUND

Insulated Gate Bipolar Transistor (IGBT) is a widely used semiconductor device. In an IGBT, when a predetermined voltage is applied to a gate electrode thereof, electrons are supplied from an emitter region to a drift region and holes are supplied from a collector region to the drift region. Due to the electrons and the holes supplied to the drift region, an ON voltage is reduced by modulating the conductivity modulation of the drift region. However, the IGBTs may experience a reduction in their withstand voltage when they are designed to have a reduced ON voltage.

DETAILED DESCRIPTION

Figure 1:
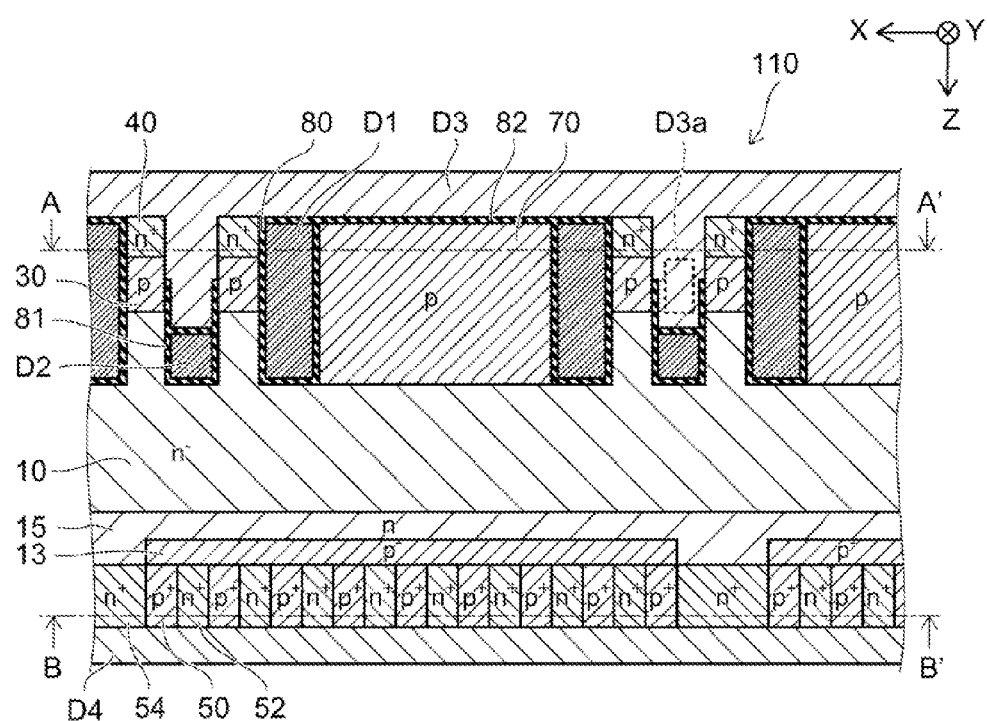
FIG. 1 is a cross sectional view of a semiconductor device taken at section C-C' of FIGS. 2 and 3 illustrating a portion of a semiconductor device according to a first embodiment.

Embodiments provide a semiconductor device capable of reducing the ON voltage while restraining a reduction of the breakdown voltage.

In general, according to one embodiment, a semiconductor device includes a first semiconductor region of a second conductivity type, a second semiconductor region of a first conductivity type, a third semiconductor region of the second conductivity type, a fourth semiconductor region of the first conductivity type, a fifth semiconductor region of the second conductivity type, a gate electrode, a first electrode, a second electrode, and a sixth semiconductor region of the second conductivity type.

The second semiconductor region is provided over the first semiconductor region.

The third semiconductor region is selectively provided on the second semiconductor region.

The fourth semiconductor region is selectively provided on the third semiconductor region.

The fifth semiconductor region is selectively provided on the third semiconductor region.

The gate electrode is disposed adjacent to the third semiconductor region with a first insulating film therebetween.

The first electrode extends inwardly of the second semiconductor region with a second insulating film therebetween. A portion of the second semiconductor region is positioned between the gate electrode and the first electrode.

The second electrode is in contact with the fifth semiconductor region and the fourth semiconductor region.

The sixth semiconductor region extends inwardly of the second semiconductor region in at least a part of the area where the third semiconductor region is not provided. The sixth semiconductor region is not in contact with the second electrode.

The embodiments will be hereinafter described with reference to the drawings.

The drawings are only schematic or conceptual, and the relation between thickness and widths of each component and the ratio of the sizes thereof may not be necessarily equal to those of an actual device. Further, in the case of illustrating the same portion of the device in different Figures, the size and the ratio may be expressed differently depending on the Figure.

In this disclosure, the same reference numerals are attached to the same elements, and thus elements having been already described will be properly omitted.

Conductivity type of a semiconductor region described in each embodiment is illustrated only as one example, and p type and n type in each semiconductor region may be inverted to apply to a semiconductor device according to each embodiment.

In the following description, the presentation of $n^+$, $n$, $n^-$, $p^+$, $p$, and $p^-$ indicates a relative degree of the dopant concentration in the respective conductivity types. Specifically, $n^+$ is relatively higher than the n in the n type dopant concentration and $n^-$ is relatively lower than the n in the n type dopant concentration. Further, $p^+$ is relatively higher than the p in the p type dopant concentration and $p^-$ is relatively lower than the p in the p type dopant concentration.

First Embodiment

Figure 2:
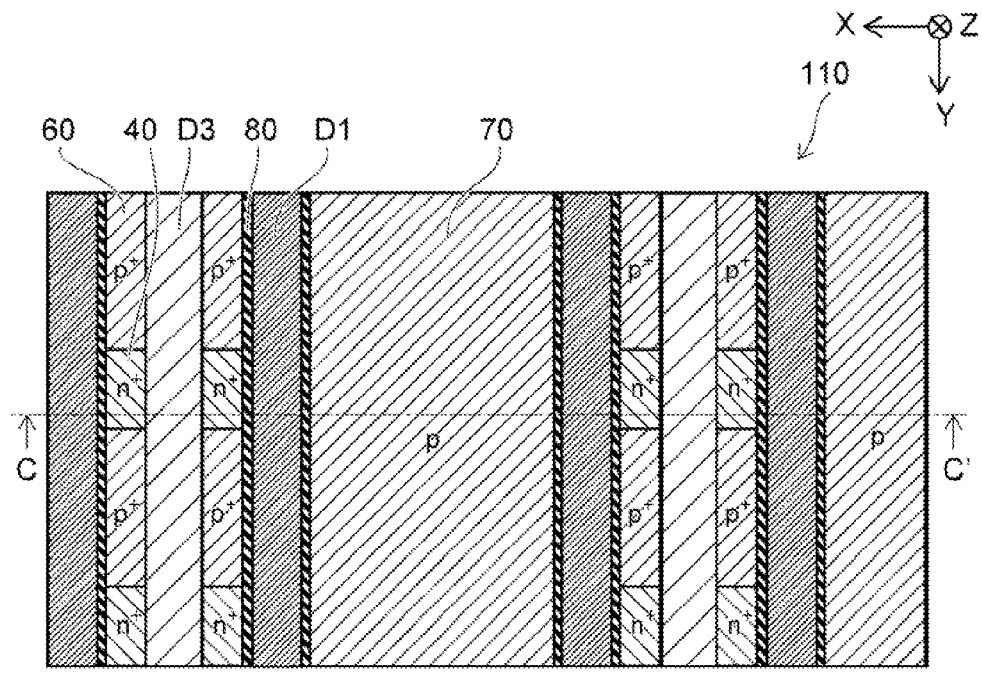
FIG. 2 is a cross sectional view of a semiconductor device taken at section A-A' of FIG. 1 illustrating a portion of the semiconductor device according to the first embodiment.
Figure 3:
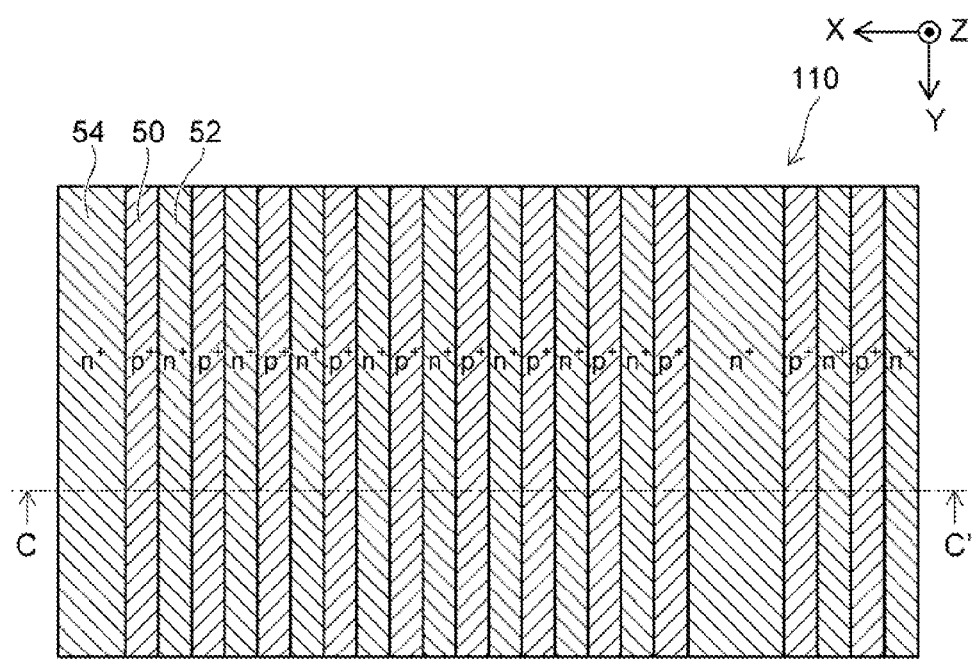
FIG. 3 is a cross sectional view of a semiconductor device taken at section B-B' of FIG. 1 illustrating a portion of the semiconductor device according to the first embodiment.

FIGS. 1, 2, and 3 are cross sectional views illustrating a semiconductor device according to a first embodiment.

FIG. 2 is a cross sectional view taken along the line A-A' in the cross section of FIG. 1.

FIG. 3 is a cross sectional view taken along the line B-B' in the cross section of FIG. 1.

FIG. 1 is a cross sectional view taken along the line C-C' in the cross section of FIG. 2.

FIG. 1 is also a cross sectional view taken along the line C-C' in the cross section of FIG. 3.

As illustrated in FIG. 1, a semiconductor device 110 according to a first embodiment includes a $p^+$ type collector region 50 (first semiconductor region), an $n^-$ type drift region 10 (second semiconductor region), a p type base region 30 (third semiconductor region), an n⁺ type source region 40 (fourth semiconductor region), a p⁺ type contact region 60 (fifth semiconductor region) (FIG. 2), a p type semiconductor region 70 (sixth semiconductor region), a gate electrode D1, an embedded electrode (first electrode) D2, a source electrode (second electrode) D3, and a collector electrode D4. The semiconductor device 110 is, for example, an IGBT.

For the sake of description, a direction from the drift region 10 to the base region 30 is defined as upper (upper side) and the opposite direction is defined as lower (lower side).

Further, a direction from the drift region 10 to the collector region 50 is defined as Z direction. A direction orthogonal to the Z direction is defined as X direction. A direction orthogonal to the Z direction and the X direction is defined as Y direction.

As illustrated in FIG. 1, a plurality of collector regions 50 are provided and are spaced apart in the X direction. As illustrated in FIG. 3, the respective collector regions 50 also extend in the Y direction. The p type dopant concentration of the collector region 50 is, for example, in the range of $1 \times 10^{17}$ cm$^{-3}$ and $1 \times 10^{21}$ cm$^{-3}$ inclusive.

The drift region 10 is provided over or above the collector regions 50. An n type semiconductor region 15 may be provided between the drift region 10 and the collector regions 50. The n type dopant concentration of the drift region 10 is, for example, in the range of $1 \times 10^{12}$ cm$^{-2}$ and $1 \times 10^{16}$ cm$^{-2}$ inclusive.

In this embodiment, for the sake of convenience of description, the n type semiconductor region 15 is to be included in the drift region 10.

The base regions 30 are selectively provided on the drift region 10. The base region 30 is in contact with the drift region 10. The p type dopant concentration of the base regions 30 is, for example, in the range of $1 \times 10^{15}$ cm$^{-2}$ and $1 \times 10^{18}$ cm$^{-2}$ inclusive.

Here, an n type barrier region (not shown) having a higher n type dopant concentration than that of the drift region may be provided between the drift region 10 and the base region 30.

As illustrated in FIG. 1, a plurality of base regions 30 are provided and are spaced from each other in the X direction. The respective base regions 30 also extend in the Y direction.

Source regions 40 are provided on selective portions of the base regions 30. Each source region 40 is in contact with at least a part of the base region 30. The n type dopant concentration of the source region 40 is higher than that of the drift region 10. The n type dopant concentration of the source regions 40 are, for example, in the range of $1 \times 10^{17}$ cm$^{-2}$ and $1 \times 10^{21}$ cm$^{-2}$ inclusive.

A plurality of source regions 40 are provided and are spaced from each other in the X direction, similarly to the base regions 30. As illustrated in FIG. 2, the respective source regions 40 extend in the Y direction.

A plurality of p⁺ type contact regions 60 (sixth semiconductor regions) (FIG. 2) are provided on selective portions of the base regions 30. As illustrated in FIG. 2, a plurality of contact regions 60 are provided and are spaced from each other in the X direction. The p type dopant concentration of the contact region 60 is, for example, in the range of $1 \times 10^{17}$ cm$^{-3}$ and $1 \times 10^{21}$ cm$^{-3}$ inclusive.

The plural source regions 40 and contact regions 60 are provided on the respective base regions 30. The source regions 40 and the contact regions 60 alternate on the base regions 30 in the Y direction.

When the semiconductor device 110 is in the ON state, electrons are injected to the drift region 10 through the source regions 40 and holes are discharged from the drift region 10 through the contact regions 60. Taking a difference of mobility between the holes and the electrons into consideration, the size of the contact region 60 in the Y direction is preferably more than the size of the source region 40 in the Y direction. More preferably, the size of the contact region 60 in the Y direction is more than twice the size of the source region 40 in the Y direction.

At the same level of the depth where the collector regions 50 are provided, a plurality of n⁺ type semiconductor regions 52 and a plurality of n⁺ type semiconductor regions 54 are provided in the area in areas between the collector regions 50.

As illustrated in FIG. 3, each of the n⁺ type semiconductor regions 52 is provided between two collector regions 50. The collector regions 50 and the n⁺ type semiconductor regions 52 alternate in the X direction. The respective n⁺ type semiconductor regions 52 extend in the Y direction. The n type dopant concentration of the n⁺ type semiconductor region 52 is, for example, in the range of $1 \times 10^{17}$ cm$^{-3}$ and $1 \times 10^{21}$ cm$^{-3}$ inclusive.

Referring to FIG. 1, the n⁺ type semiconductor regions 54 are provided under the n type semiconductor region 15 in an area where the p⁻ type semiconductor regions 13 are not provided. The n type dopant concentration of the n⁺ type semiconductor region 54 is, for example, in the range of $1 \times 10^{17}$ cm$^{-3}$ and $1 \times 10^{21}$ cm$^{-3}$ inclusive.

The p⁻ type semiconductor region 13 is provided between the collector regions 50 and n⁺ type semiconductor regions 52 and the n type semiconductor region 15. The p type dopant concentration of the p⁻ type semiconductor region 13 is, for example, in the range of $1 \times 10^{15}$ cm$^{-3}$ and $1 \times 10^{19}$ cm$^{-3}$ inclusive.

The p⁻ type semiconductor region 13 and the n⁺ semiconductor region 54 extend in the Y direction.

Although the p⁻ type semiconductor region 13 is not the component essential to this embodiment, it is preferably provided in order to control an inflow of the holes from the collector electrode D4 into the n⁻ type drift region 10 (second semiconductor region).

Although the n⁺ type semiconductor region 52 is essential to this embodiment, it is preferably provided in order to electrically fully connect the p⁻ type semiconductor region 13 and the collector electrode D4. Although the n⁺ type semiconductor region 54 is not essential to this embodiment, it is preferably provided in order to discharge carriers remaining in the drift region 10 for a shorter period, for example, when the IGBT is turned off.

The gate electrode D1 is selectively provided on the drift region 10 with an insulating film layer forming a gate insulating film 80 therebetween. The gate electrodes D1 extend in parallel with the base regions 30 in the X direction.

The gate electrode D1 penetrates through the adjacent source regions 40, the adjacent contact regions 60, and the adjacent base regions 30 and reaches the drift region 10, with an insulating film layer forming a gate insulating film 80 therebetween.

The respective gate electrodes D1 extend in the Y direction. The gate electrode D1 is, for example, polycrystalline silicon with dopant added thereto. A metal may also be used as the material of the gate electrode D1.

In the X direction, the gate electrode D1 faces the base region 30 through a gate insulating film 80 (first insulating film). The gate electrode D1 may face at least a part of the source region 40 and a part of the drift region 10 with the gate insulating film 80 extending therebetween. For example, silicon oxide or silicon nitride may be used as the material of the gate insulating film 80.

The embedded electrode D2 is provided on the drift region 10 with an insulating film (second insulating film) 81 extending therebetween. The embedded electrode D2 is provided between adjacent gate electrodes D1 in the X direction and in a location between, and below, adjacent base regions 30 and source regions between adjacent gate electrodes D1. The embedded electrode D2 may be electrically connected to the source region 40. In other words, the embedded electrode D2 may be at the same potential as that of the source electrode D3. The embedded electrode D2 extends between the adjacent gate electrodes D1 in the Y direction. The embedded electrode D2 functions as, for example, a field plate electrode.

The insulating film 81 is provided between the embedded electrode D2 and the p type semiconductor region 70 and between the embedded electrode D2 and the source electrode D3, in addition to between the embedded electrode D2 and the drift region 10. As the material of the insulating film 81, for example, the same material as the gate insulating film 80 may be used.

The lower end of the embedded electrode D2 is positioned at substantially the same level of the depth as the lower end of the gate electrode D1, i.e., to the same depth in the drift region 10. When the embedded electrode D2 makes contact with the source region 40, the semiconductor device 110 works in the same way as that having a structure that a part of the source electrode D3 extends to the side of the collector electrode D4 to the same degree as the gate electrode D1. According to this structure, a capacitance between gate and collector is reduced, hence improving a controllability of the gate potential or a switching controllability. More specifically, a reduction of the switching speed caused by a capacitance between gate and collector may be restrained.

The source electrode D3 extends over and along one side of the source regions 40 and the contact regions 60. The source electrode D3 is in direct contact with the source regions 40 and the contact regions 60. The source electrode D3 is also extends over the p type semiconductor region 70, the gate electrodes D1, and the embedded electrode D2, in each case with an insulating film 80 or 81 therebetween. The base regions 30 are ohmically-connected to the source electrode D3 through the contact regions 60. In operation the source electrode D3 is connected to a fixed potential, for example, the ground potential.

The source electrode D3 includes a portion D3a provided on the embedded electrode D2.

In the embodiment, the portion D3a is provided between the adjacent base regions 30. Adjacent base regions 30 adjacent, and between, adjacent gate electrodes D1 respectively are in contact with the portion D3a provided on one embedded electrode D2. In other words, a plurality of base regions 30 share one portion D3a.

Further, a portion of the portion D3a is separated from the base regions 30 through a portion of the insulating film 81. In other words, the base region 30 includes a portion in direct contact with the source electrode D3 and a portion facing the source electrode D3 through the insulating film 81 on a lateral side thereof.

The p type semiconductor region 70 is provided on the drift region 10 at least in the areas other than areas where the base regions 30, gate electrodes D1 and buried electrodes D2 are located. The p type semiconductor region 70 abuts the gate electrodes D1 in the X direction, with insulating layer 80 therebetween. The gate electrodes D1 adjacent to the p type semiconductor regions 70 and the embedded electrode D2 provided between the gate electrodes D1 are located between adjacent p type semiconductor regions 70 in the X direction. The p type semiconductor regions 70 are spaced from the collector regions 50 and the n+ type semiconductor regions 52 in the Z direction by at least the drift region 10.

An insulating film 82 is provided between the p type semiconductor region 70 and the source electrode D3. The p type semiconductor region 70 is not in contact with the source electrode D3. Therefore, the holes existing in the drift region 10 are discharged to the source electrode D3 through the base regions 30, but not through the p type semiconductor region 70. Accordingly, the quantity of holes flowing to the source electrode D3 is reduced and the injection amount of the electrons to the drift region 10 is relatively increased, because the interface area between the base regions 30 and the drift region is significantly reduced by the presence of the p-type semiconductor region 70 which is electrically isolated from the source electrode D3, but not the drift region 10. As the result, ON resistance is reduced, which may reduce the ON voltage. The p type dopant concentration of the p type semiconductor region 70 is, for example, in the range from $1 \times 10^{15}$ cm$^{-3}$ to $1 \times 10^{19}$ cm$^{-3}$ (both inclusive).

A p type semiconductor region in contact with the source electrode D3 may be provided between the two gate electrodes D1 adjacent to the p type semiconductor region 70 in the end portion of the p type semiconductor region 70 in the Y direction, so long as the p type semiconductor region does not disturb the accumulation of the holes in the p type semiconductor region 70 too much. The span of the p type semiconductor region in contact with the source electrode D3 in the Y direction is preferably set at 1/10 and less of the span of the p type semiconductor region 70 in the Y direction in order not to significantly disturb the accumulation of holes in the p type semiconductor region 70.

The collector electrode (fourth electrode) D4 is provided under the collector regions 50 and the n+ semiconductor regions 52. The collector electrode D4 is in contact with the collector regions 50 and the n+ type semiconductor regions 52. In operation, holes are injected into the collector regions 50 from the collector electrode D4.

Next, an operation of the semiconductor device 110 will be described.

When a potential is applied to the collector electrode D4 and a potential lower than that of the collector electrode D4 is applied to the source electrode D3, a potential of a threshold and more is applied to the gate electrode D1. According to this, a channel (inversion layer) is formed near an interface with the gate insulating film 80 in the base region 30.

For example, a ground potential or a negative potential is applied to the source electrode D3 and a positive potential is applied to the gate electrode D1. A positive potential higher than the gate electrode D1 is applied to the collector electrode D4. As a result, electrons are injected into the base regions 30 from the source regions 40 through the channels, hence to put the semiconductor device 110 in the ON state. Also, holes are injected from the collector regions 50 to the drift region 10. Passing through the base regions 30, the holes injected to the drift region 10 flow from the contact regions 60 to the source electrode D3. When the semiconductor device 110 is in the ON state, the holes are injected from the collector regions 50 to the drift region 10, a conductivity modulation is generated, and a resistance in the drift region 10 is reduced.

Then, when a potential lower than the threshold is applied to the gate electrode D1, the inversion layers in the base regions 30 disappear, hence to put the device in the OFF state. In the OFF state, the holes generated in the drift region 10 are discharged to the source electrode D3 through the contact regions 60 or the base regions 30 adjacent to the source regions 40. The contact regions 60 may discharge the holes generated in the drift region 10 efficiently, and consequently improve breakdown strength.

In order to reduce the ON voltage in the semiconductor device, a method of increasing the density of the holes existing in an area of the drift region side of the source electrode is effective. By increasing the density of the holes existing in the area of the drift region side of the source electrode, an inflow amount of the electrons to the drift region may be increased and the ON voltage may be reduced. In the embodiment, the frequency of the number of gate electrodes D1 is reduced, i.e., they are spaced further apart in the x direction than in a traditional power semiconductor device. In the embodiment shown in FIG. 1, the gap between the gate electrodes D1 on either side of the p-type semiconductor region 70, and the width of the p-type semiconductor region 70, is greater than the spacing between two gate electrodes adjacent to, and on opposite sides of, a buried electrode D3. In the area where the gate electrode D1 frequency is reduced out, the resulting the p type semiconductor region 70 is not in contact with the source electrode D3. Since the p type semiconductor region 70 is not in contact with the source electrode D3, holes are not discharged to the source electrode D3 through the p type semiconductor region 70. Therefore, the density of the holes existing in the area of the drift region 10 side of the source electrode D3 are increased. It is possible that the p type semiconductor region 70 contacts with the source electrode D3 if the density of the holes existing in the area of the drift region 10 side of the source electrode D3 is not increased.

By providing the p type semiconductor region 70 in the area where the gate electrode D1 frequency is reduced, a reduction of a breakdown voltage in the semiconductor device is restrained.

Here, a form of providing an n type semiconductor region in the area where the gate electrode D1 frequency is reduced, instead of the p type semiconductor region 70, is considered. When a positive voltage to the source electrode D3 is applied to the collector electrode D4, a depletion layer expands from a pn interface between the base region 30 and the drift region 10. The depletion layer expands downwardly from the area between the gate electrode D1 and the embedded electrode D2. In the example illustrated in FIG. 1, the depletion layers expanding from spaces between the embedded electrode D2 and the two gate electrodes D1 adjacent to the embedded electrode D2, overlap with each other in the lower portion of the embedded electrode D2 and expand in the Z direction. In contrast, in the lower portion of the gate electrode D1, the depletion layer expands in an arc shape. As the result, in the lower portion of the gate electrode D1, the electric field intensity gets higher and a breakdown voltage in the semiconductor device is reduced in some cases.

In the embodiment, however, the p type semiconductor region 70 is provided in the area between gate electrodes D1. By providing the p type semiconductor region 70, the depletion layer expands even from the pn interface between the p type semiconductor region 70 and the drift region 10. The depletion layer from the pn interface between the p type semiconductor region 70 and the drift region 10 overlaps with the depletion layer from the pn interface between the base region 30 and the drift region 10, in the lower portion of the gate electrode D1 and the depletion layer expands in the Z direction. According to this, a rise in the electric field intensity in the lower portion of the gate electrode D1 may be restrained and a reduction of a breakdown voltage in the semiconductor device may be restrained.

When the gate electrode D1 frequency is reduced and the number of the gate electrodes D1 is thus reduced, the number of channels per unit area is reduced and short circuit current is decreased. As a result, short circuit capacity is increased.

A reduction of the gate electrode D1 frequency means reduction of the contact regions 60 per unit area, discharging of holes from the drift region 10 is restrained, and accumulation of holes at under region of the gate electrodes D1 is increased. As a result, the injection of the electrons to the drift region 10 is increased (IE effect) and the ON voltage is reduced by modulating the conductivity modulation of the drift region 10.

In order to further reduce the ON voltage in the semiconductor device, it is preferable that the space between adjacent gate electrodes D1 or the space between the gate electrode D1 and the adjacent buried electrode D2 should be reduced and that discharging of holes from the drift region 10 should be decreased, which reduces the widths of the base regions 30, source regions 40 and contact regions 60. As a result, the IE effect is increased and the injection amount of the electrons to the drift region 10 is increased, which reduces the ON voltage.

When the space between the adjacent gate electrodes D1 or gate electrode D1 and adjacent buried electrode D2 gets narrower, however, there arises the problem that an electric connection between the base region 30 and the source electrode D3 may not be fully established because the contact area of the source electrode D3 and the contact region 60 gets smaller.

When the electric connection between the base region 30 and the source electrode D3 is not fully established, the base region 30 does not have the same potential as that of the source electrode D3 and the potential of the base region 30 becomes unstable. As the result, a channel formed in the base region 30 gets unstable and the supply amount of the electrons to the base region 30 may be reduced disadvantageously.

In order to solve this, according to the embodiment, the base region 30 is formed to be directly connected to the source electrode D3. The base region 30 is in direct contact with the source electrode D3 on a lateral side thereof.

Therefore, even when the space between the gate electrode D1 and the embedded electrode D2 is small, the base region 30 may be fully electrically connected to the source electrode D3, which makes the potential of the base region 30 stable. As the result, the channel formed in the base region 30 is stable.

As mentioned above, according to the embodiment, by providing the p type semiconductor region 70 which does not contact the source electrode D3, in the area where the gate electrode D1 density is reduced (spacing between gate electrodes D1 increased), the density of the holes existing in the area of the drift region 10 side of the source electrode D3 may be enhanced while restraining a rise in the electric field intensity in the lower portion of the gate electrode D1.

Further, by having the base region 30 in contact with the source electrode D3, even when the gate electrode D1 density is reduced, the electrons may be supplied to the base region 30 stably while restraining a reduction in the channel density.

As the result, while restraining the reduction of the breakdown voltage in the semiconductor device, the density of carriers in the drift region 10 may be increased and the ON voltage in the semiconductor device may be significantly reduced.

By sharing the portion D3a between a plurality of, in FIG. 1, two, base regions 30, the number of the embedded electrodes D2 and the portions D3a necessary for contacting base regions 30 with the source electrode D3 may be reduced and the channel density may be enhanced.

Further, the insulating film 81 extends to a space between the base region 30 and the source electrode D3 (portion D3a), which enhances channel stability, as well as stabilized the supply of electrons to the base region 30.

The above is because of the following reasons:

When the embedded electrode D2 is connected to a fixed potential, an inversion layer (accumulation area of electrons) is formed in the area facing the embedded electrode D2 of the drift region 10. Electrons are accumulated in the inversion layer. When a distance between the inversion layer and the source electrode D3 becomes smaller, electrons flow out from the inversion layer to the source electrode D3 and there is a possibility that the semiconductor device may not operate normally. With the insulating film 81 extending at least partially into the interface between the base region 30 and the source electrode D3, the source electrode D3 may be fully distant from the inversion layer of the drift region 10.

Second Embodiment

Figure 4:
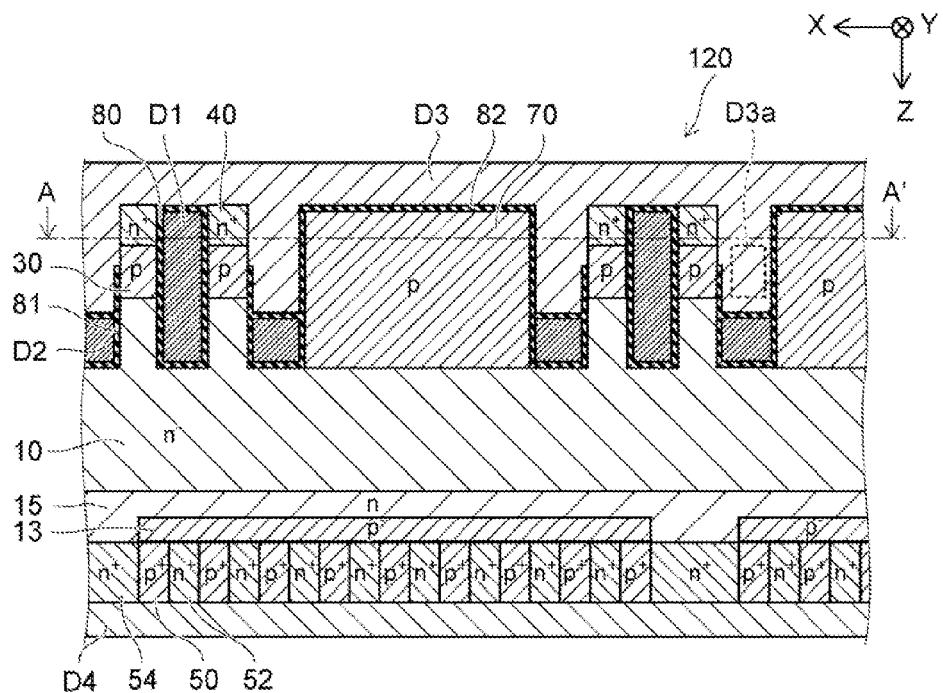
FIG. 4 is a cross sectional view of a semiconductor device taken at section B-B' of FIG. 5 illustrating a portion of a semiconductor device according to a second embodiment.
Figure 5:
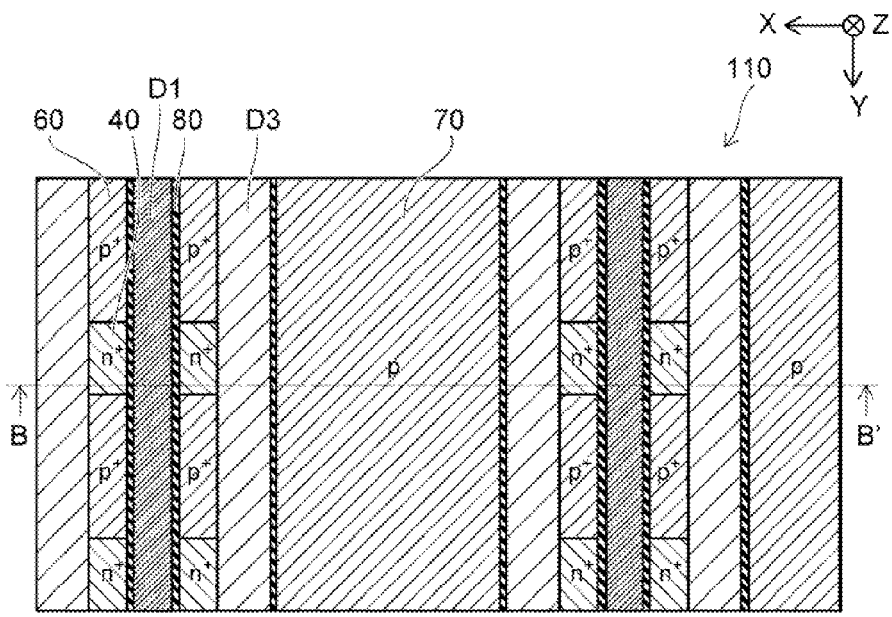
FIG. 5 is a cross sectional view of a semiconductor device taken at section A-A' of FIG. 4 illustrating a portion of the semiconductor device according to the second embodiment.

FIGS. 4 and 5 are cross sectional views illustrating the structure of a semiconductor device according to a second embodiment.

FIG. 5 is a cross sectional view taken along the line of A-A' in the cross section of FIG. 4.

FIG. 4 is a cross sectional view taken along the line of B-B' in the cross section of FIG. 5.

A semiconductor device 120 according to the embodiment is different from the semiconductor device 110 according to the first embodiment in the positional relation between the gate electrode D1 and the embedded electrode D2.

The p type semiconductor region 70 is provided on the drift region 10 at a position extending between embedded electrodes D2. The embedded electrodes D2 adjacent to the p type semiconductor region 70 and the gate electrode D1 provided between the embedded electrodes D2 are provided between two adjacent p type semiconductor regions 70 in the X direction.

As mentioned above, when the semiconductor device is in the ON stage, since the p type semiconductor region 70 is not in contact with the source electrode D3, holes are accumulated in the p type semiconductor region 70. When the p type semiconductor region 70 is directly adjacent to the gate electrode D1, negative charge is induced to the gate electrode D1 according to the holes accumulated in the p type semiconductor region 70 and a negative capacitance may occur in the gate electrode D1 in some cases. When a negative capacitance occurs in the gate electrode D1, there may occur a breakdown of the semiconductor device due to a voltage oscillation of the gate electrode D1 in switching the semiconductor device or an excessive current in turning on the semiconductor device. Accordingly, a negative charge induced to the gate electrode D1 is preferably smaller.

In the embodiment, the embedded electrodes D2 are provided at a directly adjacent to the p type semiconductor region 70 on one side thereof. In the first embodiment, a distance between the p type semiconductor region 70 and the gate electrode D1 is shorter than a distance between the p type semiconductor region 70 and the embedded electrode D2. On the contrary, in this embodiment, a distance between the p type semiconductor region 70 and the gate electrode D1 is longer than a distance between the p type semiconductor region 70 and the embedded electrode D2. Also, the gap between the buried electrodes D3 on either side of the p-type semiconductor region 70, and the width of the p-type semiconductor region 70, is greater than the spacing between two buried electrodes D3 adjacent to, and on opposite sides of, a gate electrode D1.

Accordingly, it is possible to restrain an induction of a negative charge to the gate electrode D1 caused by holes accumulated in the p type semiconductor region 70.

Further, similarly to the first embodiment, since the p type semiconductor region 70 is provided also in this embodiment, indirect contact with the base region 30 and the source electrode D3, the ON voltage may be significantly reduced while restraining a reduction of a breakdown voltage in the semiconductor device.

Third Embodiment

Figure 6:
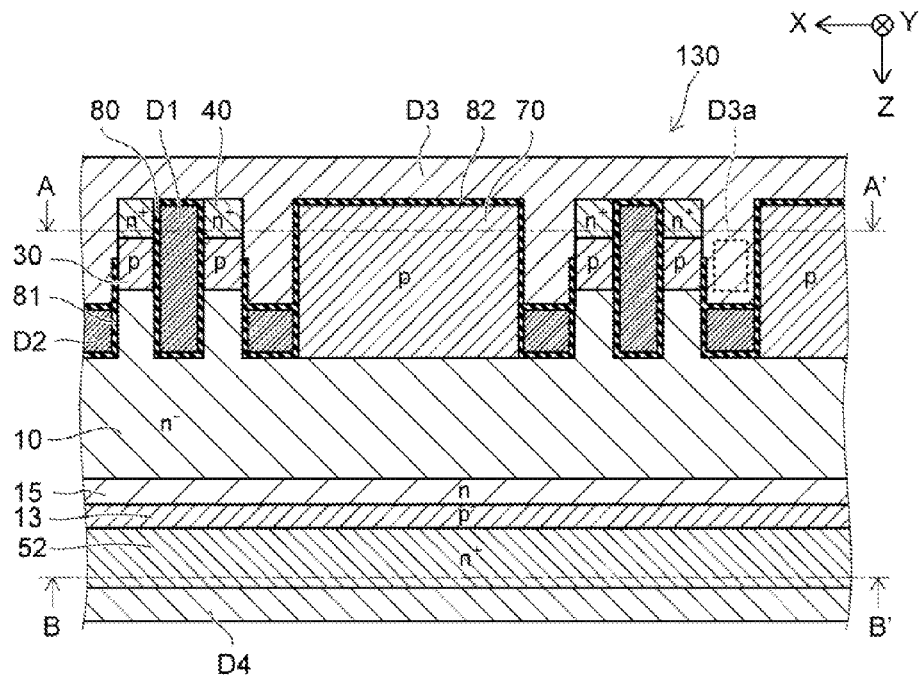
FIG. 6 is a cross sectional view of a semiconductor device taken at section C-C' of FIG. 7 illustrating a portion of a semiconductor device according to a third embodiment.
Figure 7:
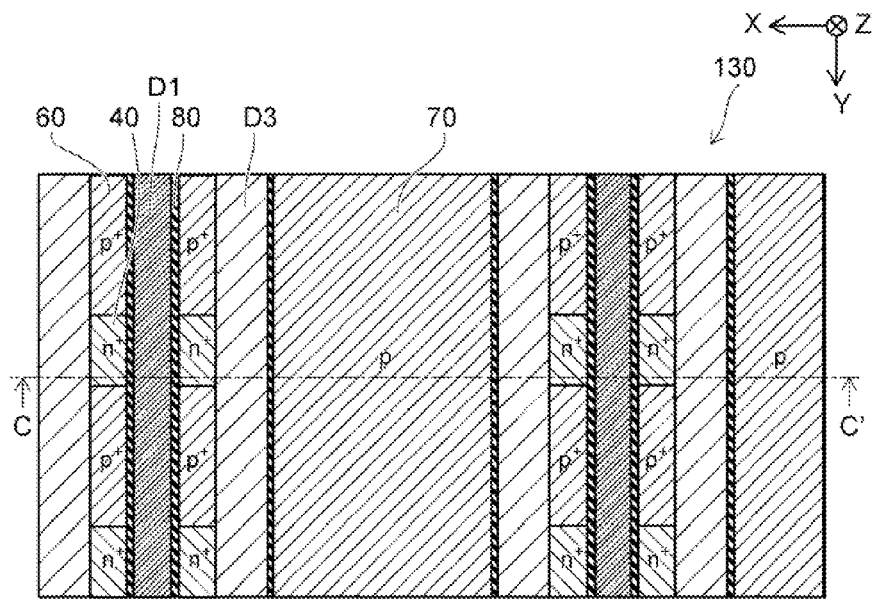
FIG. 7 is a cross sectional view of a semiconductor device taken at section A-A' of FIG. 6 illustrating a portion of the semiconductor device according to the third embodiment.
Figure 8:
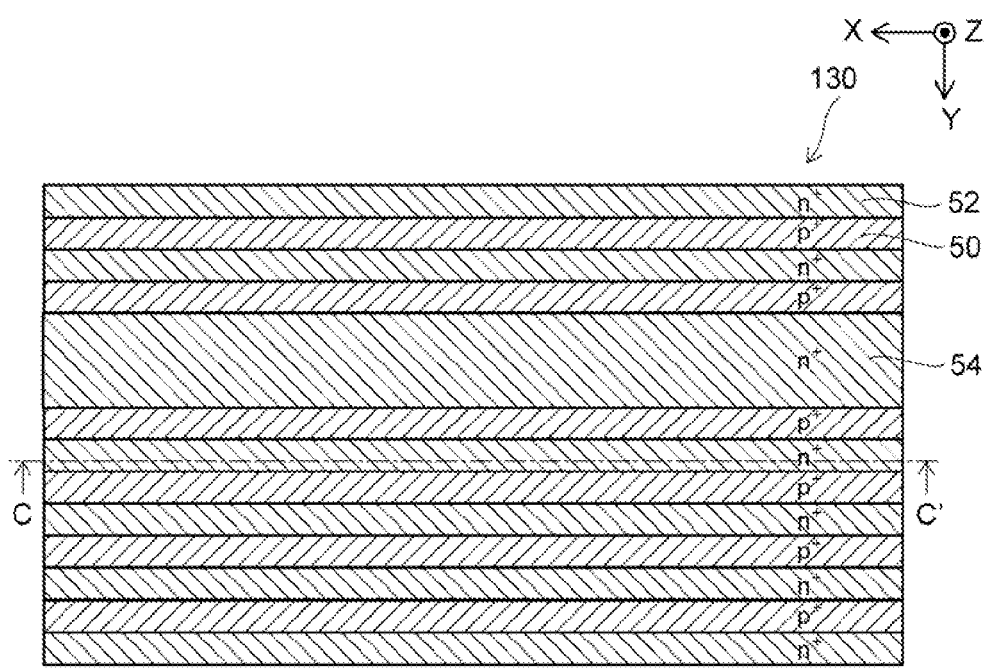
FIG. 8 is a cross sectional view of a semiconductor device taken at section B-B' of FIG. 6 illustrating a portion of the semiconductor device according to the third embodiment.

FIGS. 6, 7, and 8 are cross sectional views illustrating a semiconductor device according to a third embodiment.

FIG. 7 is a cross sectional view taken along the line of A-A' in the cross section of FIG. 6.

FIG. 8 is a cross sectional view taken along the line of B-B' in the cross section of FIG. 6.

FIG. 6 is a cross sectional view taken along the line of C-C' in the cross section of FIG. 7.

FIG. 6 is also a cross sectional view taken along the line of C-C' in the cross section of FIG. 8.

A semiconductor device 130 according to this embodiment is different from the semiconductor device 120 according to the second embodiment in the positional relation between the p⁻ type semiconductor region 13, the collector region 50, the n⁺ type semiconductor region 52, the n⁺ type semiconductor region 54, and the gate electrode D1.

As illustrated in FIG. 8, in this embodiment, the n⁺ type semiconductor region 52 and the n⁺ type semiconductor region 54 extend in the X direction. Further, the n⁺ type semiconductor regions 52 and the collector regions 50 alternate in the Y direction.

On the contrary, a plurality of gate electrodes D1 are provided spaced apart in the X direction, each extending in the Y direction.

In other words, a disposition direction of the gate electrodes D1 is orthogonal to a direction of the alternating n⁺ type semiconductor regions 52 and the n⁺ type semiconductor regions 54.

In the following description, for the sake of convenience, the n⁺ type semiconductor region 52 and the n⁺ type semiconductor region 54 are referred to as a lower structure.

According to this structure, as compared to the case where the disposition direction of the gate electrodes D1 is the same as the direction of alternately providing the n⁺ type semiconductor regions 52 and the n⁺ type semiconductor regions 54, movement of carriers between the collector electrode D4 and the source electrode D3 is minimally affected by the positional relation between the gate electrode D1 and the lower structure, which makes the operation in the semiconductor device stable.

It is the most preferable that the disposition (length) direction of the gate electrodes D1 is orthogonal to the length direction of the alternately n⁺ type semiconductor regions 52 and n⁺ type semiconductor regions 54. However, as long as the length direction of the gate electrodes D1 crosses the length direction of the alternating n⁺ type semiconductor regions 52 and n⁺ type semiconductor regions 54, the above-mentioned effect may be obtained.

Similarly to the first embodiment and the second embodiment, the p type semiconductor region 70 is provided also in this embodiment, and a portion of the base regions 30 are in direct contact with the source electrode D3; therefore, the ON voltage may be significantly reduced while restraining a reduction of a breakdown voltage in the semiconductor device.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first semiconductor region of a first conductivity type;
    a second semiconductor region of a second conductivity type provided over the first semiconductor region;
    a third semiconductor region of the first conductivity type selectively provided on the second semiconductor region;
    a fourth semiconductor region of the second conductivity type selectively provided on the third semiconductor region;
    a fifth semiconductor region of the first conductivity type selectively provided on the third semiconductor region;
    a gate electrode disposed adjacent to the third semiconductor region with a first insulating film therebetween;
    a first electrode extending inwardly of the second semiconductor region with a second insulating film therebetween, a portion of the second semiconductor region positioned between the gate electrode and the first electrode;
    a second electrode that extends into the second semiconductor region in contact with the fifth semiconductor region and the fourth semiconductor region; and
    a sixth semiconductor region of the first conductivity type extending inwardly of the second semiconductor region in at least a part of an area where the third semiconductor region is not provided, and not in contact with the second electrode.

2. The semiconductor device according to claim 1, wherein
    a plurality of gate electrodes are provided,
    the first electrode is provided between two adjacent gate electrodes, and
    the sixth semiconductor region extends between two gate electrodes, one of which is also a gate electrode where the first electrode is provided between two gate electrodes.

3. The semiconductor device according to claim 1, wherein
    a plurality of the first electrodes are provided,
    the gate electrode is provided between two of the plurality of first electrodes, and
    the sixth semiconductor region is located adjacent to one of the two of the plurality of first electrodes.

4. The semiconductor device according to claim 1, wherein
    a portion of the second electrode is located adjacent to the third semiconductor region and is at least partially surrounded by the second insulating film.

5. The semiconductor device according to claim 1, further comprising:
    a plurality of semiconductor regions of the second conductivity type selectively provided under the second semiconductor region, wherein
    a plurality of the first semiconductor regions are provided under the second semiconductor region, and
    each of the plurality of semiconductor regions is provided between adjacent first semiconductor regions.

6. The semiconductor device according to claim 5, wherein
    the gate electrode extends in a first direction,
    the plurality of the first semiconductor regions and plurality of semiconductor regions extend in a second direction which crosses the first direction.

7. The semiconductor device according to claim 6, wherein the first direction is orthogonal to the second direction.

8. The semiconductor device according to claim 6, wherein
    the first semiconductor regions and the plurality of semiconductor regions extend in a direction orthogonal to the extending direction of the second semiconductor region.

9. A semiconductor device comprising:
    a first semiconductor region of a first conductivity type extending in a first direction;
    a second semiconductor region of a second conductivity type extending in a second direction that is different than the first direction;
    a third semiconductor region of the first conductivity type selectively provided on the second semiconductor region and extending in the first direction;
    a fourth semiconductor region of the second conductivity type selectively provided on the third semiconductor region and extending in the first direction;
    a fifth semiconductor region of the first conductivity type selectively provided on the third semiconductor region and extending in the first direction;
    a gate electrode disposed adjacent to the third semiconductor region with a first insulating film therebetween;
    a first electrode extending inwardly of the second semiconductor region with a second insulating film therebetween, a portion of the second semiconductor region positioned between the gate electrode and the first electrode;
    a second electrode in contact with the fifth semiconductor region and the fourth semiconductor region; and
    a sixth semiconductor region of the first conductivity type extending inwardly of the second semiconductor region in at least a part of an area where the third semiconductor region is not provided, and not in contact with the second electrode.

10. The semiconductor device according to claim 9, further comprising:

a plurality of gate electrodes, wherein the first electrode is provided between two adjacent gate electrodes of the plurality of gate electrodes.

11. The semiconductor device according to claim 10, wherein
the sixth semiconductor region extends between two gate electrodes of the plurality of gate electrodes.

12. The semiconductor device according to claim 9, wherein
a portion of the second electrode is located adjacent to the third semiconductor region and is at least partially surrounded by the second insulating film.

13. The semiconductor device according to claim 9, further comprising:
a plurality of semiconductor regions of the second conductivity type selectively provided under the second semiconductor region, wherein
a plurality of the first semiconductor regions are provided adjacent to the second semiconductor region, and
each of the plurality of semiconductor regions is provided between adjacent first semiconductor regions.

14. The semiconductor device according to claim 13, wherein
the gate electrode extends in the first direction,
the plurality of the first semiconductor regions and plurality of semiconductor regions extend in the second direction.

15. The semiconductor device according to claim 14, wherein the first direction is orthogonal to the second direction.

16. The semiconductor device according to claim 14, wherein
the first semiconductor regions and the plurality of semiconductor regions extend in a direction orthogonal to the extending direction of the second semiconductor region.

17. A semiconductor device comprising:
a first semiconductor region of a first conductivity type extending in a first direction;
a second semiconductor region of a second conductivity type extending in a second direction that is different than the first direction;
a third semiconductor region of the first conductivity type selectively provided on the second semiconductor region and extending in the first direction;
a fourth semiconductor region of the second conductivity type selectively provided on the third semiconductor region and extending in the first direction;
a fifth semiconductor region of the first conductivity type selectively provided on the third semiconductor region;
a gate electrode disposed adjacent to the third semiconductor region with a first insulating film therebetween;
a first electrode extending inwardly of the second semiconductor region with a second insulating film therebetween, a portion of the second semiconductor region positioned between the gate electrode and the first electrode;
a second electrode in contact with the fifth semiconductor region and the fourth semiconductor region, the second electrode extending at least partially into the second semiconductor region; and
a sixth semiconductor region of the first conductivity type extending inwardly of the second semiconductor region in at least a part of an area where the third semiconductor region is not provided, and not in contact with the second electrode.

18. The semiconductor device according to claim 17, further comprising:
a plurality of gate electrodes, and the first electrode is provided between two adjacent gate electrodes of the plurality of gate electrodes.

19. The semiconductor device according to claim 18, wherein
the sixth semiconductor region extends between two gate electrodes of the plurality of gate electrodes.

20. The semiconductor device according to claim 17, wherein
a portion of the second electrode is located adjacent to the third semiconductor region and is at least partially surrounded by the second insulating film.

* * * * *